United States Patent
Farkas et al.

(10) Patent No.: US 7,951,729 B2
(45) Date of Patent: May 31, 2011

(54) SEMICONDUCTOR DEVICE INCLUDING A COUPLED DIELECTRIC LAYER AND METAL LAYER, METHOD OF FABRICATION THEREOR, AND MATERIAL FOR COUPLING A DIELECTRIC LAYER AND A METAL LAYER IN A SEMICONDUCTOR DEVICE

(75) Inventors: Janos Farkas, St Ismier (FR); Srdjan Kordic, Eindhoven (NL); Cindy Goldberg, Austin, TX (US)

(73) Assignee: NXP B.V., Eindhoven (NL)

( * ) Notice: Subject to any disclaimer, the term of this patent is extended or adjusted under 35 U.S.C. 154(b) by 1 day.

(21) Appl. No.: 12/705,038

(22) Filed: Feb. 12, 2010

(65) Prior Publication Data

US 2010/0139526 A1   Jun. 10, 2010

Related U.S. Application Data

(62) Division of application No. 12/065,179, filed as application No. PCT/EP2006/065903 on Sep. 1, 2006, now Pat. No. 7,691,756.

(30) Foreign Application Priority Data

Sep. 1, 2005  (EP) ................... PCT/EP2005/010688

(51) Int. Cl.
*H01L 21/31* (2006.01)
*H01L 23/58* (2006.01)

(52) U.S. Cl. ........ 438/780; 438/781; 438/790; 257/642; 257/759

(58) Field of Classification Search .................. 438/680, 438/681, 780, 781, 789, 790; 257/642, 643, 257/759

See application file for complete search history.

(56) References Cited

U.S. PATENT DOCUMENTS

| | | | |
|---|---|---|---|
| 2,828,279 A | 3/1958 | Lewis | |
| 5,256,480 A | 10/1993 | Inoue et al. | |
| 5,462,603 A * | 10/1995 | Murakami | 118/719 |
| 5,658,387 A * | 8/1997 | Reardon et al. | 118/323 |
| 6,203,582 B1 * | 3/2001 | Berner et al. | 29/25.01 |
| 6,245,690 B1 | 6/2001 | Yau et al. | |
| 6,486,061 B1 | 11/2002 | Xia et al. | |
| 6,582,767 B1 | 6/2003 | Fukushima et al. | |
| 2001/0012869 A1 | 8/2001 | Fukushima et al. | |
| 2003/0199162 A1 | 10/2003 | Seki | |

FOREIGN PATENT DOCUMENTS

| | | |
|---|---|---|
| DE | 4234959 C1 | 4/1994 |
| JP | 62256804 A | 11/1987 |
| JP | 62296139 A | 12/1987 |
| JP | 63258909 A | 10/1988 |
| JP | 01101308 A | 4/1989 |
| JP | 01141915 A | 6/1989 |
| WO | 2004041938 A1 | 5/2004 |

OTHER PUBLICATIONS

Steinmetrz, M.G; et al "Solution-Phase Far-UV Photochemistry of Unsaturated Organosilanes: Deydrosilylation, Dyotropic Rearrangement, and Protodesilylation" Journal of Organic Chemistry, vol. 51, No. 26, 1986, pp. 5051-5063.

Bain S; et al "Mechanism of Silanone Extrusion From Alkoxyvinylsilanes" Organometallics, vol. 6, No. 5, 1987, pp. 1136-1138.

Shacham-Diamand Y; et al "Integrated Electroless Metallization for USLI" ELECTROCHIMCA ACTA (Electroch. ACTA), 1999, vol. 44, pp. 3639-3649.

Farkas, J: et al FTIR Studies of the Adsorption/Desorption Behavior of CU Chemical Vapor Deposition Precursors on Silica, IV. Interaction of (1,1,1,5,5,5-Hexafluoroacetylacetonato) (2-Butyne)Copper(1), (HFAC)CU(2-Butyne) and (1,1,1,5,5,5-Hexafluoroacetylacetonato) (Vinyltrimethysilance)Copper(1), (HFAC(CU(VTMS)).

Szabo, K: et al "Monofunctional (Dimethyamino) Silane as Silylating Agent" Helvetica CHIMICA ACTA (Helv. Chimi. ACTA), Dec. 19, 1984, vol. 67 (8), pp. 2128-2142.

* cited by examiner

*Primary Examiner* — Kevin M Picardat

(57) ABSTRACT

A passivating coupling material for, on the one hand, passivating a dielectric layer in a semiconductor device, and on the other hand, for permitting or at least promoting liquid phase metal deposition thereon in a subsequent process step. In a particular example, the dielectric layer may be a porous material having a desirably decreased dielectric constant k, and the passivating coupling material provides steric shielding groups that substantially block the adsorption and uptake of ambient moisture into the porous dielectric layer. The passivating coupling materials also provides metal nucleation sides for promoting the deposition of a metal thereon in liquid phase, in comparison with metal deposition without the presence of the passivating coupling material. The use of a liquid phase metal deposition process facilitates the subsequent manufacture of the semiconductor device. In one example, the passivating coupling material has multiple Si atoms in its chemical composition, which desirably increases the thermal stability of the material.

19 Claims, No Drawings

US 7,951,729 B2

SEMICONDUCTOR DEVICE INCLUDING A COUPLED DIELECTRIC LAYER AND METAL LAYER, METHOD OF FABRICATION THEREOR, AND MATERIAL FOR COUPLING A DIELECTRIC LAYER AND A METAL LAYER IN A SEMICONDUCTOR DEVICE

FIELD OF THE INVENTION

The present invention relates to a passivating coupling material that most generally facilitates the manufacture of a semiconductor device by coupling a porous or non-porous dielectric layer to a metal layer formed thereover, particularly a metal layer formed in liquid phase. In a particular example, the material acts as a passivation layer with respect to the dielectric layer on which it is formed (for example, to seal a porous dielectric layer having a relatively low dielectric constant, k, against moisture uptake). This same material is additionally able to present metal nucleation sites for the subsequent formation of a metal layer thereon (whether or not the layer below being passivated is porous). Metal deposition is therefore facilitated compared with the absence of the passivating coupling material, such that it can be considered to "couple" the metal layer to the dielectric layer. The present invention also relates to a method of fabricating a semiconductor device particularly including the liquid-phase formation of a metal layer on the passivated dielectric layer.

BACKGROUND OF THE INVENTION

As feature size in integrated circuits decreases, it is increasingly important to reduce the resistance-capacitance delay (RC delay) attributable to interconnects used in such circuits. In order to reduce this RC delay, it is currently thought that advanced interconnects should have a reduced dielectric constant (k). In particular, these interconnects should be made of low-k materials. As a first step, carbonated silicon dioxide (SiOC) films have been conventionally introduced in the 90-120 nm technology nodes. A current focus is to further improve the k-value by introducing pores in such carbonated silicon dioxide films.

The term "carbonated silicon dioxide films" and the corresponding formula "SiOC" are used to designate silicon dioxide films including carbon therein (e.g., by using $CH_3SiH_3$ in place of the $SiH_4$ that is often used as a precursor in the formation of a silicon dioxide layer). Such films are sometimes also referred to in the art as carbon-doped silicon dioxide films.

Carbonated silicon dioxide films are being developed by several vendors, using chemical vapor deposition or spin-on coating techniques. Several vendors are currently developing CVD-deposited SiOC films using a "porogen" approach. With this technology, the porogens are built into a dielectric film and are degassed during the post-treatment, leaving pores in the film. Applied Materials (Black Diamond IIx; III), Novellus systems (ELK Coral), Trikon (Orion), and ASM are amongst the companies working on this approach. Suppliers of spin-on porous dielectric materials include Dow Chemicals (SiLK), Rohm & Haas (Zirkon), and JSR.

However, it is known in the art that a silicon oxide-containing material (like a carbonated silicon dioxide) has a substantial population of surface hydroxyl (silanol) groups on its surface. These groups have a strong tendency to take up water because they are highly polarized. They are generated by the break up of four and six member bulk siloxane (Si—O—Si) bridges at the surface of the material. These siloxane structures at the material surface have an uncompensated electric potential and so can be considered to be "strained". They react readily with ambient moisture to form the surface hydroxyl groups. If the silicon oxide-containing material is porous, the surface hydroxyls and the adsorbed water molecules tend to propagate into the bulk of the material, causing an increase in the dielectric constant and reducing film reliability.

A comparable effect occurs in other materials, such as metal oxides, present on the surface of a wafer. The metal ion-oxide bonds located at the surface of the material have an uncompensated electric potential. This likewise leads to a ready reaction with ambient moisture so as to form surface hydroxyl groups. Once again, if the material is porous, the surface hydroxyls and adsorbed water molecules will propagate to the bulk of the material and lead to an unwanted increase in dielectric constant.

As mentioned above, carbonated silicon oxide is often used as a porous dielectric material. Its carbon-rich surface has relatively fewer strained oxide bonds. Thus, there is a reduced population of surface hydroxyls at the surface of the material.

However, the tendency for water uptake is still quite high in carbon-containing porous dielectric materials after a dry etch process. The oxidizing plasma reduces the carbon content at the surface of the material and therefore increases the population of surface hydroxyls. The dielectric constant k therefore increases after dry etching, so the k value of the film must be "restored." An example of such a restoration of the dielectric constant is the application of a supercritical $CO_2$ treatment with hexamethyldisilazane (HMDS).

In addition to problems caused by moisture present in ambient air, it is also conventional to use aqueous cleaning solutions to clean the surface of the wafer during semiconductor fabrication.

For example, when a semiconductor integrated circuit is manufactured, vias and other trench-like structures must be etched in one or more layers formed on a semiconductor substrate. When vias or trench-like structures are etched, polymer residues may build up in the via/trench because of a reaction between hydrocarbon etchant gases in the plasma and the substrate material. In addition, metallic species (e.g. copper) may be inadvertently sputtered onto the sidewalls.

It is thus desirable to clean a surface of the wafer to remove the polymer residues (and metallic species, if any), before proceeding to the subsequent stages in the manufacturing process. Conventional cleaning processes may use aqueous cleaning solutions such as dilute hydrofluoric acid (HF) or organic acid/base solutions.

However, these types of aqueous cleaning solutions are not suitable when the surface being cleaned has a tendency to adsorb water, and particularly when the surface is porous, such as the surface of a porous dielectric layer. If aqueous cleaning solutions were used after via etching to clean a wafer having a porous dielectric layer thereon, the porous material adsorbs water from the cleaning fluids. This problem may be even more problematic if the dielectric layer is damaged by plasma etching during the etching process.

Besides negatively affecting the dielectric constant of the porous dielectric layer, adsorbed water can also cause problems during subsequent stages in the manufacture of the circuit, notably degassing and reliability problems.

For the reasons described above, it is important to prevent water adsorption and uptake if porous dielectric materials are used to form interconnects. Moreover, moisture uptake in a porous dielectric could possibly corrode tantalum-based barrier layers.

Some known approaches to combat moisture uptake by porous dielectric materials during manufacture and use of a semiconductor integrated circuit include "dielectric restoration" as referred to hereinabove, as well as "pore sealing."

Pore sealing involves prevention of access to the pores in the porous material, for example, by modifying the surface of the porous material (e.g. using an organosilane treatment), or by depositing a thin dielectric film on the surface of the porous dielectric layer.

The latter solution of depositing a thin dielectric film has a disadvantage of increasing the k value of the layer. In some cases, it is applied to the porous dielectric layer after vias have been etched therein.

Accordingly, an alternative known approach for post-via-etch cleaning of a wafer having a porous dielectric material involves applying supercritical carbon dioxide ($CO_2$) to the etched surface as mentioned above. However, this approach disadvantageously requires investment in new process equipment which is at a more experimental stage in development than the cleaning equipment commonly used in the semiconductor manufacturing industry.

In addition to the foregoing issues concerning porous dielectric materials, subsequent conventional metallization (i.e., the formation of various metal layer structures) is relatively slow and complex, and is therefore relatively expensive. In this regard, atomic layer deposition, chemical vapor deposition, and physical vapor deposition are typical methods for forming metal layers. Such processes require, in particular, separate and relatively complex process equipment operating under strict operating conditions.

SUMMARY OF THE INVENTION

In view of the foregoing, the present invention relates to a passivated dielectric layer in a semiconductor device, wherein the composition of the passivation material furthermore promotes the subsequent deposition of a metal layer thereon (particularly in liquid phase) compared to metal deposition without the presence of the passivation material. The invention also relates to a method of manufacturing a semiconductor device including such a passivated dielectric layer.

Because the passivation material acts to promote the formation of such a metal layer with respect to a dielectric layer thereunder, reference is made herein to a "passivating coupling layer" in order to reflect both characteristics.

A "passivating coupling material" (and terms corresponding thereto, like "passivating coupling layer" and the like) as used in the present description of the present invention is meant to refer to a material (or, as the case may be, layer), having a chemical composition as described hereinbelow. It is formed over a dielectric layer (porous or not) in a semiconductor device (and thus acts as a passivating layer) and, in a certain example, promotes the formation of a metal layer thereon, as also described hereinbelow. In this latter regard, the material acts as a coupling agent or material in that it promotes the formation of the subsequent material layer thereon, in comparison with the absence of the passivating coupling material.

For example, the passivating coupling material of the present invention can be particularly useful for sealing a porous dielectric layer (which, as discussed above, has a desirably reduced dielectric constant) against moisture uptake and is also conducive to the subsequent formation of metal layers thereon in liquid phase during subsequent fabrication steps. With regard to this latter aspect, the passivating coupling material provides nucleation sites for promoting liquid phase metal deposition in comparison to depositing metal directly on the dielectric layer.

Additionally, the passivating coupling material of the present invention is thermally stable with respect to relatively high temperature manufacturing steps performed subsequent to the formation of the liquid phase metal layer on the passivated dielectric layer.

DETAILED DESCRIPTION OF PREFERRED EMBODIMENTS

Some preferred embodiments of the present invention are described hereinbelow.

It is noted that the description refers, strictly by way of example, to a porous SiOC dielectric layer formed on a semiconductor substrate. However, the present invention is fully applicable to any porous dielectric layer that is prone to have surface hydroxyls thereon according to the foregoing explanation, including, for example and without limitation, TEOS (tetraethylorthosilicate) and FTEOS (fluorine-doped tetraethylorthosilicate) dielectric layers.

Moreover, it is also expressly noted that the present invention is also useful with respect to non-porous dielectric layers to the extent that it still functions at least to promote metal nucleation to support liquid phase metal layer formation.

Accordingly, the description of the invention set forth hereinbelow illustrates the function of the passivating coupling material for both pore sealing and for promoting metal layer formation, although the passivating coupling material can also be used for one function or the other alone.

In general, according to the present invention, a passivating coupling material is applied to the porous dielectric layer surface so as to react with the surface hydroxyls which are present thereon, as discussed hereinabove.

This reaction between the passivating coupling material and the surface hydroxyls attaches one or more shielding groups present in the passivating coupling material molecules to the surface of the porous dielectric. The gaps between the attached shielding groups are too small to allow water molecules to reach the surface of the porous dielectric material. The attached shielding groups provide steric shielding and block or at least hinder the passage of moisture.

It is contemplated that the shielding groups may be considered optional in some circumstances, especially if the layer being passivated is less prone or even not prone to adsorb and/or take up moisture, such as non-porous layers.

On the other hand, the molecules of the passivating coupling material also define metal nucleation sites that facilitate and promote the formation of a metal layer, in comparison to metal deposition without the presence of the passivating coupling layer.

A variety of materials can be used to passivate the porous dielectric material according to the present invention. Generally, an appropriate passivating coupling material according to the present invention:

includes at least one functional group that can react with surface hydroxyls commonly present on the surface of the porous dielectric material, includes a second functional group (i.e., a ligand) having an electron donor functionality to provide a reactive site (more specifically, a metal nucleation site) on the passivated surface for subsequent metallization, preferably includes at least two silicon atoms in the molecular backbone for thermally stabilizing the passivating coupling material, especially during subsequent relatively high temperature processing steps, and preferably includes a plurality of organic shielding groups, which form at least one, and preferably at least two, shielding layers above the surface of the porous dielectric layer for blocking moisture uptake.

It is also advantageous if the passivating coupling material is soluble and the functional group(s) thereof has/have a sufficiently fast reaction speed with surface hydroxyls, as explained below.

The passivating coupling material could for example be usefully soluble in water. However, it may also be useful to have a material soluble in alcohols (such as, for example, ethanol or isopropanol) or in an organic solvent like toluene.

The passivating coupling material may include at least one functional group which can be hydrolyzed in water.

An appropriate passivating coupling material is, for example, an organosilane according to the following general formula:

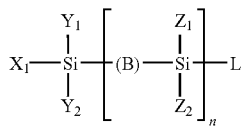

in which:

n is an integer equal to or greater than 1 (i.e., 1, 2, 3, 4, 5, 6, 7 . . . ), each Si is a silicon atom;

$X_1$ is a functional group able to react with a surface hydroxyl site of the porous dielectric material.

$Y_1$ is either:

$X_2$, which is a further functional group able to react with a surface hydroxyl site of the porous dielectric material, H, which is a hydrogen atom, or $R_1$, which is an organic apolar group or branch;

$Y_2$ is either:

$X_3$, which is a further functional group able to react with a surface hydroxyl site of the porous dielectric material, H, which is a hydrogen atom, or $R_2$, which is an organic apolar group or branch B, the presence of which is optional, is a bridging group, $Z_1$ is either:

$R_3$, which is an organic apolar group or branch,

H, which is a hydrogen atom, or $L_1$, which is a ligand having an electron donor functionality and is able to act as a metal nucleation site, $Z_2$ is either:

$R_4$, which is an organic apolar group or branch,

H, which is a hydrogen atom, or $L_2$, which is a ligand having an electron donor functionality and is able to act as a metal nucleation site, and L is a ligand having an electron donor functionality and is able to act as a metal nucleation site.

The strength of the bond between the passivating coupling material and the porous dielectric material, and the speed at which it reacts with the surface hydroxyls is believed to depend on what functional groups are present and on the number of the silicon groups in the passivating coupling material.

Fundamentally, organosilanes form stronger bonds to the surface than hydrocarbon chains that do not contain silicon, and therefore provide a more stable protection for the porous dielectric layer surface. Also, the presence of at least one, and preferably at least two, silicon atoms in the main chain ("backbone") of the molecule as described herein makes the molecule more thermally stable, particularly in view of the temperatures encountered in performing subsequent process steps. For example, after liquid phase metallization, a subsequent dielectric layer deposition and cure may entail temperatures of, for example, about 350° C. In comparison, for example, a molecule having carbon (for example, aliphatic or aromatic carbon) in the backbone would likely oxidize at such temperatures.

In the foregoing molecule, at least one of the organic apolar groups $R_1$, $R_2$, $R_3$, and $R_4$ is present to provide steric shielding from the hydroxyl groups and water molecules in the form of at least one, and preferably at least two, steric shielding layers according to their connection to the respective Si atoms.

Studies in other fields suggest that properly chosen organic layers could be efficient to sterically shield non-porous dielectric surfaces from precursors (such as metalorganic compounds), see, for example, J. Farkas et al., *J. Electrochem. Soc.* 141, 3547 (1994). With porous materials it could be expected that the size of the shielding groups R should be proportional to the size of pores.

The effect of R on steric shielding by organosilanes has been studied in the field of high-pressure liquid gas chromatography column treatment, see, for example, K. Szabo et al, *Hely. Chimi. Acta.* vol. 67, p. 2128, (1984).

The Farkas et al. paper showed that an organic layer less than about 25 Angstroms thick can be efficient for sterically shielding a surface from water penetration, even at elevated temperatures. When using a passivation material to shield a porous dielectric surface, the length of the hydrocarbon chain can be easily adjusted to optimize the efficiency of steric shielding to the pore size of the dielectric.

According to an embodiment of the invention, the organic apolar group(s) $R_1$, $R_2$, $R_3$, and/or $R_4$ may be an optionally halogenated $C_1$ to $C_{10}$ alkyl, $C_2$ to $C_{10}$ alkenyl, or $C_6$ to $C_{10}$ aryl or aralkyl group, which is/are preferably selected from: methyl, ethyl, propyl, butyl, phenyl, pentafluorophenyl, 1, 1, 2-trimethylpropyl (thexyl), and allyl.

That is, $R_1$ and/or $R_2$, if present as $Y_1$ and/or $Y_2$, will form a first steric shielding layer; $R_3$ and/or $R_4$, if present as $Z_1$ and/or $Z_2$, forms a second, third, fourth, fifth, etc., steric shielding layer depending on the number n of monomers present in the chain.

Functional groups $X_1$, $X_2$, and $X_3$ should have a structure such that they are able to react with the surface hydroxyl sites of the porous dielectric material and attach one of more shielding layers in the passivating coupling material to the surface of the porous dielectric material. More particularly, the X functional group reacts by the elimination of the surface hydroxyl.

Some examples of appropriate functional groups in this regard include, without limitation, -chloride, -bromide, iodine, acryloxy-, alkoxy-, acetamido, acetyl-, allyl-, amino-, cyano-, epoxy-, imidazolyl, mercapto-, methanosulfonato-, sulfonato-, trifluoroacetamido, and urea-containing groups The ligand L should have an electron donor functionality, and, once the molecule is attached to the surface of the porous dielectric material, forms a reaction site for metal nucleation during a subsequent liquid phase metallization process.

Ligands appropriate to the present invention include, without limitation, vinyl, allyl, 2-butynyl, cyano, cyclooctadienyl, cyclopentadienyl, phosphinyl, alkylphosphinyl, sulfonato, and amine groups.

In certain instances, the functional groups and the ligands could be the same mono-, bi-, and tri-functional amines (which would form strong interactions with both the porous dielectric thereunder and the metal layers subsequently formed thereon).

The concept of the molecule will be shown using a series of representative compounds by way of example and without limitation. It will be appreciated that the example molecules shown below can be made longer or shorter according to the number of n monomers that are present therein. The index n is most generally an integer of 1 or greater. More preferably, n is an integer between 1 and 30, inclusive. Most preferably, n is an integer between 1 and 18, inclusive, i.e., 1, 2, 3, 4, 5, 6 . . . 17, or 18.

The bridging group B, if present, can be, for example, a divalent bridging group (such as oxygen or sulfur), a trivalent bridging group (such as nitrogen or phosphorus), or a tetravalent bridging group (such as carbon or silicon), and may be, more particularly, silylene and unsaturated aromatic carbon-containing groups such as m-phenylene, p-phenylene, and p,p'-diphenyl ether. The bridging group, when present, may further improve the thermal stability of the passivating coupling material molecule.

EXAMPLE 1

Methoxy-tetramethyl-vinyl-disilane:

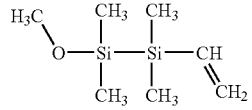

in which the $X_1$ functional group is $H_3CO$— (methoxy) group; the $Y_1, Y_2, Z_1, Z_2$ functional groups are —$CH_3$ (methyl) organic shielding groups; B is absent; and the ligand L is a —CH=$CH_2$ vinyl group.

EXAMPLE 2

Trimethoxy-dimethyl-vinyl-disilane

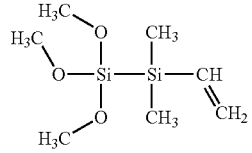

in which the $X_1, Y_1$, and $Y_2$ functional groups are $H_3CO$— (methoxy groups); the $Z_1$ and $Z_2$ functional groups are $CH_3$ methyl organic shielding groups; B is absent; and the ligand L is a —CH=CH2 vinyl group.

EXAMPLE 3

Vinyltetramethylmethoxydisiloxane (bridging group B present)

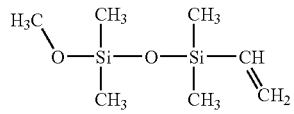

in which the $X_1$ functional group is a $H_3CO$-(methoxy) group; the $Y_1, Y_2, Z_1, Z_2$ functional groups are —$CH_3$ (methyl) organic shielding groups; the bridging group B is oxygen (forming a disiloxane compound); and the ligand L is a C=$CH_2$ vinyl group.

The addition of a bridging group B (such as oxygen in this example) can significantly affect the thermal stability of the coupling layer. Silylene and unsaturated carbon-containing carbene groups such as m-phenylene, p-phenylene, and p,p'-diphenyl ether are additional examples of bridging groups that can be used according to this invention to further improve the thermal stability of the passivating coupling material molecule.

EXAMPLE 4

Methoxy-tetramethyl-butyl-disilane (alternative ligand)

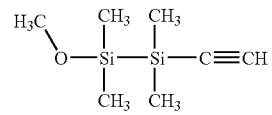

in which the $X_1$ functional group is a $H_3CO$— (methoxy) group; the $Y_1, Y_2, Z_1, Z_2$ functional groups are —$CH_3$ (methyl) organic shielding groups; the bridging group B is absent; and the ligand L is a —C≡CH acetylenyl group.

EXAMPLE 5

Methoxy-hexamethyl-vinyl-trisilane (alternative molecule length)

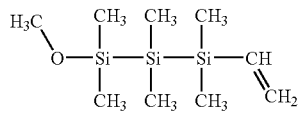

in which the $X_1$ functional group is a $H_3CO$— (methoxy) group; $Y_1, Y_2, Z_1, Z_2$ functional groups are —$CH_3$ (methyl) organic shielding groups; the bridging group B is absent; and the ligand L is a —CH=$CH_2$ (vinyl) group.

The passivating coupling material of the present invention can be applied on the surface of a porous dielectric material in accordance with known methods for applying compositions including, generally and without limitation, gas phase, liquid phase, or spray chamber application.

However, liquid phase application, if used, must address the above-noted issues of moisture adsorption, as the passivating coupling material is typically diluted in water, possibly with an organic solvent (such as, for example, alcohol) added to further increase the solubility of the passivating coupling material. Also, some of the noted examples of functional groups suitable for the present invention can be hydrolyzed. Liquid phase application can be performed, for example, at temperatures between about 25° C. and 80° C. with process times between about 30 s to 10 min.

An appropriate concentration range of the passivating coupling material is 0.001 to 10% by mass of passivating coupling material with respect to the overall mass of a liquid phase composition comprising the passivating coupling material. An advantageous range is 0.01 to 3% of mass of passivating coupling material with respect to the overall mass of liquid phase composition.

With respect to the possibility of liquid phase deposition of the passivating coupling material, the present invention most generally contemplates the use of an aqueous solution containing the passivating coupling material to deposit a passivating coupling layer over a dielectric layer. Preferably, the reaction speed between the passivating coupling material and silanols formed on the surface of the porous dielectric layer is sufficiently fast such that that reaction takes places before any appreciable uptake of moisture from the aqueous solvent occurs.

In other words, the reaction desirably should be fast enough to sterically shield the porous dielectric layer before the dielectric layer starts adsorbing water from the solvent.

In a particular example of liquid application of the passivating coupling material, it is known that polymeric residues tend to form on the wafer, particularly, but not necessarily only, because of chemical reaction between hydrocarbon etching gases and the substrate material during a preceding etching step. Thus, the application of the passivating coupling material as described above can be impeded by the presence of regions covered by such residues.

Thus, the passivating coupling material can be combined with an aqueous cleaning composition appropriate for removing the polymeric residues. As mentioned above, the reaction speed should be sufficiently fast so that the passivating coupling material reacts with silanols on the surface of the porous dielectric material effectively as soon as the residues are removed by the cleaning composition. Water adsorption can therefore be blocked.

For example, if the passivating coupling material is a water-soluble organosilane, it can be mixed with the cleaning fluid(s) ahead of application thereof to the wafer. However, if the passivating coupling material consists of an organosilane which is traditionally considered not to be water-soluble when mixed with water, notably because of its short "pot" life (i.e., shelf life), it can be still be used in certain embodiments of the present invention. More particularly, if the organosilane has a short pot life when mixed with water, the organosilane and the cleaning fluid(s) can be mixed at, or in the immediate vicinity of, the cleaning tool (i.e. just before application to the wafer).

According to one example, therefore, a passivating process using the passivating coupling material of the present invention includes the following parameters:

the applied cleaning mixture is a soluble organosilane according to the description herein, mixed with an organic acid, or highly diluted aqueous HF, or a salt thereof), and optionally includes a chelating agent and/or surfactant process temperature=20-80° C., and process time=30 s to 10 min After the residual polymers and/or metallic residues are removed, the porous dielectric material is sealed by the passivating coupling layer.

As indicated above, if desired, additional complexing or chelating agents may be used in order to remove metallic species. These reagents should be added into the solution, so as to be able to be processed in a common series of steps. Common complexing agents include ethylenediaminetetraacetic acid (EDTA) and its derivatives and organic acids.

Similarly, a wide variety of surfactants can be included in the solution. For example, it may be advantageous to use block co-polymers built from blocks of poly(ethyleneoxide) and poly(propyleneoxide) as a surfactant. These two groups are efficiently absorbing on both hydrophobic and hydrophilic surfaces, and the length and ratio of each group present in the block co-polymer can easily be tailored to the application.

Instead of liquid deposition of the passivating coupling material using an aqueous solution, it can be applied in gas phase using a carrier gas like nitrogen or argon combined with the material. Gas phase application can be performed between about 150° C. and about 300° C.

Another possible approach to avoid the difficulties of using an aqueous solution application is to use a spray application in a predetermined environment, particularly in an inert environment. The inert environment may for example be argon, nitrogen, or carbon dioxide, with, for example, a humidity of less than about 1%. The inert atmosphere may be at ambient pressure.

Once the porous dielectric material is appropriately passivated with the passivating coupling material of the present invention, metallization can be performed thereafter in liquid phase starting with an electroless deposition (as known, for example, from Shacham-Diamand, *Electroch. Acta, vol.* 44 (1999), 3639). After deposition of a barrier/seed layer in this fashion, a copper film can be deposited thereon by conventional electrodeposition, as is known in the field of semiconductor manufacture. Liquid application of the metal layer on the passivating coupling layer permits metal deposition on the passivating coupling layer without having to "switch" process lines to gas phase metal deposition equipment.

EXAMPLE 6 AND COMPARATIVE EXAMPLES 1-3

A comparative test was performed to evaluate the relative effects of using different types of dielectric surface pre-treatment prior to electroless metal deposition.

A dielectric substrate was treated with various pre-clean solutions, as indicated in Table 1. The samples used were of size 1 $cm^2$ cut from a wafer having metal interconnects made from copper conductor and an $SiO_2$ dielectric. In each case the pH was in the range of 2.8 to 2.9, and treatment with an excess of pre-clean solution in a beaker was carried out for 2 minutes at 22° C. After treatment with pre-clean solution, the substrates were dried using nitrogen gas in these experiments (although it may be noted in passing that an alternative system has been developed in which isopropyl alcohol (IPA) in a 10% solution in water was used to assist in drying). Electroless deposition was then performed using a three-component chemistry system to deposit a cobalt tungsten boron (CoWB) alloy as described in U.S. Pat. No. 6,924,232. More specifically, a first solution is prepared consisting of a mixture of a cobalt source ($CoSO_4.7H_2O$), sodium citrate ($C_6H_5Na_3O_7.2H_2O$), malic acid ($C_4H_6O_5$), and the surfactants Zonyl® FS-300, Zonyl® FSJ and Tetronic® 304, using tetramethylammonium hydroxide (TMAH) or potassium hydroxide to adjust the pH to between 9 and 10. This first solution is then mixed with a second solution of sodium tungstate ($Na_2WO_4.2H_2O$) and then a third solution of morpholine borane. The final mixture is chosen to have a cobalt concentration equivalent to 27 to 35 grams of cobaltous sulfate heptahydrate per litre, 27 to 35 grams of sodium citrate per litre, 27 to 35 grams of malic acid per litre, 5 to 15 grams of sodium tungstate per litre, and 5 to 15 grams of morpholine borane per litre. The amount of surfactants is between 15 and 100 ppm. Electroless CoWB plating is carried out at a temperature of 50° C. to 60° C.

TABLE 1

|  | Comparative Example 1 | Comparative Example 2 | Example 6 | Comparative Example 3 |
|---|---|---|---|---|
| Pre-clean solution | A | B | C | D |
| Citric acid (g per L) | 20 | 20 | 20 | 20 |
| Malic acid (g per L) | 20 | 20 | 20 | 20 |
| Ammonium persulfate (g per L) | 20 | 20 | 20 | 20 |
| Silane | — | 0.5% by mass of Sivento Dynasylan HS2627 (mono-functional water soluble aminosilane) | 0.5% by mass of Sivento Dynasylan HS2776 (bi-functional water soluble aminosilane) | 0.5% by mass of Sivento Dynasylan HS2909 (mono-functional water soluble aminosilane) |
| Observations at the time of treating with pre-clean solution | — | Solution showed no signs of hydrolysis | Solution showed no signs of hydrolysis | Cloudy solution after adding the silane - silane hydrolysed and formed silica precipitates |
| Observations during electroless deposition | No metal deposition observed by scanning electron microscopy (SEM) | No metal deposition observed by scanning electron microscopy (SEM) | Metal deposition observed by scanning electron microscopy (SEM) | No metal deposition observed by scanning electron microscopy (SEM) |

The above-described presence of multiple Si atoms in the backbone, plus the optional presence of a bridging group B, increases the thermal stability of the passivating coupling material such that it can tolerate the temperatures associated with subsequent high-temperature manufacturing steps, such as gas phase deposition of a subsequent metal layer. In contrast, thermal decomposition of the shielding groups, if any, can be acceptable because their steric shielding function is no longer needed at that point.

In addition, the ligand L has an electron donor functionality and provides nucleation sites for the subsequently deposited metal. The fact that $Z_1$ and/or $Z_2$ can additionally be corresponding ligands further enhances the formation of a metal layer by presenting additional nucleation sites.

Although the present invention has been described above with reference to certain particular preferred embodiments, it is to be understood that the invention is not limited by reference to the specific details of those preferred embodiments. More specifically, the person skilled in the art will readily appreciate that modifications and developments can be made in the preferred embodiments without departing from the scope of the invention as defined in the accompanying claims.

For example, the ligands L provided in the passivating coupling material according to the present invention are meant to provide metal nucleation sites in order to promote or facilitate metal layer formation. However, the ligands L may in certain situations tend to be reactive with other metallic structures in a semiconductor device, such as copper metal exposed in etched vias, or metallic barrier layers in the semiconductor device (such as, for example, a cobalt alloy-based self-aligned barrier layer, as is known in the art).

As described hereinabove, the passivating coupling material has one or more functional groups X at an "end" thereof that are able to react with a surface hydroxyl site present on a dielectric material. The other "end" of the polymer has ligand(s) for providing metal nucleation sites to promote metal layer formation. However, a problem could arise if, for example, the ligands L instead reacted with, for example, a copper metal structure in an exposed via (with the functional groups X either reacting with surface hydroxyls as intended, or perhaps remaining unattached such that the polymer is in a sense inverted from its intended state). As a result, the passivating coupling material would present a reduced ability to promote metal layer deposition because of the reduction in available ligands acting as nucleation sites.

Accordingly, it may be desirable to formulate the passivating coupling material to reduce or avoid such interaction with other metallic structures forming part of the semiconductor device.

Alternatively, some additional processing steps could be implemented in order to render the metal structures relatively insensitive to the passivating coupling material. For example, the surface of a copper metal structure could be treated (i.e., protectively covered with) with a chemically appropriate organic amine. This modification of the copper metal surface can give rise to chemical bonds with the passivating coupling material which are weaker than those between the passivating coupling material and the dielectric material thereunder. When the passivating coupling material has been thereafter deposited as desired, a subsequent degassing step (using, for example, a thermal treatment) can be applied to remove any passivating coupling material from the copper metal areas, this being facilitated by the above-mentioned weak bonds created by the pretreatment of the copper metal surface.

Thereafter, in either case, a liquid phase metal deposition step can be performed in accordance with the foregoing description by seeding the nucleation sites presented by the passivating coupling material as described and claimed herein using liquid metal precursors or liquid metal salts, in a manner well known in the field of metal deposition. Alternatively, a gas phase metal precursor could be used.

The invention claimed is:

1. A passivating coupling material for passivating a dielectric material and for facilitating metal deposition on such a passivated dielectric material, characterized in that the passivating coupling material is an organosilane according to the general formula:

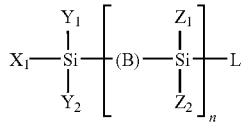

in which:
  n is an integer equal to or greater than 1,
  each Si is a silicon atom;
  $X_1$ is a functional group able to react with a surface hydroxyl site of the dielectric material,
  $Y_1$ is either:
    $X_2$, which is a further functional group able to react with a surface hydroxyl site of the dielectric material,
    H, which is a hydrogen atom, or
    $R_1$, which is an organic apolar group or branch;
  $Y_2$ is either:
    $X_3$, which is a further functional group able to react with a surface hydroxyl site of the dielectric material,
    H, which is a hydrogen atom, or
    $R_2$, which is an organic apolar group or branch,
    B, the presence of which is optional, is a bridging group,
  $Z_1$ is either:
    $R_3$, which is an organic apolar group or branch,
    H, which is a hydrogen atom, or
    $L_1$, which is a ligand having an electron donor functionality and is able to act as a metal nucleation site,
  $Z_2$ is either:
    $R_4$, which is an organic apolar group or branch,
    H, which is a hydrogen atom, or
    $L_2$, which is a ligand having an electron donor functionality and which is able to act as a metal nucleation site, and
  L is a ligand able to act as a metal nucleation site.

2. The material as recited in claim 1, wherein at least one of $Z_1$ and $Z_2$ is, respectively, $R_3$ and $R_4$.

3. The material as recited in claim 1, wherein n is an integer between 1 and 30, inclusive.

4. The material as recited in claim 1 wherein n is an integer of 1,2,3,4,5,6,7,8,9,10,11,12,13,14,15,16,17, or 18.

5. The material as recited in claim 1, wherein $X_1$, and $X_2$ and/or $X_3$ if present, are selected from the group consisting of: -chloride, -bromide, iodine, acryloxy-, alkoxy-, acetamido, acetyl-, allyl-, amino-, cyano-, epoxy-, imidazolyl, mercapto-, methanosulfonato-, sulfonato-, triflouroacetamido, and urea-containing groups.

6. The material as recited in claim 1, wherein L, and $L_1$ and/or $L_2$ if present, is selected from the group consisting of vinyl, allyl, 2-butyryl, cyano, cyclooctadienyl, cyclopentadienyl, phosphinyl, alkylphosphinyl, sulfonato, and amine groups.

7. The material as recited in claim 1, wherein B is a silylene or a carbene group.

8. The material as recited in claim 7, wherein B is selected from the group consisting of m-phenylene, p-phenylene, and p,p'-diphenyl ether.

9. The material as recited in claim 1 wherein $R_1$, $R_2$, $R_3$, and/or $R_4$, if present, are selected from the group consisting of methyl, ethyl, propyl, butyl, phenyl, pentafluorophenyl, 1,1,2-trimethylpropyl (thexyl), and allyl.

10. An aqueous solution comprising an organosilane, according to the general formula:

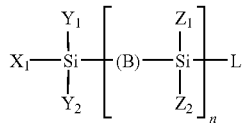

in which:
  n is an integer equal to or greater than 1,
  each Si is a silicon atom,
  $X_1$ is a functional group able to react with a surface hydroxyl site of the dielectric material,
  $Y_1$ is either:
    $X_2$, which is a further functional group able to react with a surface hydroxyl site of the dielectric material,
    H, which is a hydrogen atom, or
    $R_1$, which is as organic apolar group or branch;
  $Y_2$ is either:
    $X_3$, which is a further functional group able to react with a surface hydroxyl site of the dielectric material,
    H, which is a hydrogen atom, or
    $R_2$, which is an organic apolar group or branch,
    B, the presence of which is optional, is a bridging group,
  $Z_1$ is either:
    $R_3$, which is an organic apolar group or branch,
    H, which is a hydrogen atom, or
    $L_1$, which is a ligand having an electron donor functionality and is able to act as a metal nucleation site.
  $Z_2$ is either:
    $R_4$, which is an organic apolar group or branch
    H, which is a hydrogen atom, or
    $L_2$, which is a ligand haying an electron donor functionality and which is able to act as a metal nucleation site, and
  L is a ligand able to act as a metal nucleation site.

11. The aqueous solution as recited in claim 10, further comprising an organic acid, hydrofluoric acid or a salt thereof.

12. The aqueous solution as recited in claim 10, further comprising a complexing or chelating agent.

13. The aqueous solution as recited in claim 10, wherein the complexing or chelating agent is chosen among the group consisting of: ethylenediaminetetraacetic acid (EDTA) and its derivatives and organic acids.

14. The aqueous solution as recited in claim 10, further comprising a surfactant.

15. The aqueous solution as recited in claim 10, wherein the surfactant is chosen among the group consisting of: block co-polymers built from blocks of poly(ethyleneoxide) and poly(propyleneoxide).

16. The aqueous solution as recited in claim 10, wherein the aqueous solution contains an organic solvent in addition to water.

17. The aqueous solution as recited in claim 16, wherein the organic solvent is an alcohol.

18. The aqueous solution as recited in claim 10, wherein the concentration of an organosilane passivating coupling material lies within the range of 0.001 to 10% by mass of organosilane with respect to the overall mass of the aqueous solution.

19. The aqueous solution as recited in claim 18, wherein the concentration of the organosilane passivating coupling material lies within the range of 0.01 to 3% by mass of organosilane with respect to the overall mass of the aqueous solution.

* * * * *